United States Patent
Yang et al.

(10) Patent No.: US 7,563,704 B2
(45) Date of Patent: Jul. 21, 2009

(54) METHOD OF FORMING AN INTERCONNECT INCLUDING A DIELECTRIC CAP HAVING A TENSILE STRESS

(75) Inventors: Chih-Chao Yang, Poughkeepsie, NY (US); Kaushik Chanda, Fishkill, NY (US); Lawrence A. Clevenger, LaGrangeville, NY (US); Yun-Yu Wang, Poughquag, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 11/162,666

(22) Filed: Sep. 19, 2005

(65) Prior Publication Data

US 2007/0063348 A1    Mar. 22, 2007

(51) Int. Cl.
*H01L 21/4763* (2006.01)
*H01L 21/44* (2006.01)

(52) U.S. Cl. .................. 438/622; 438/672; 438/687; 438/688; 257/E21.476

(58) Field of Classification Search .......... 438/622, 438/687–688, 672
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,303,505 B1 | 10/2001 | Ngo et al. | |
| 6,319,819 B1 | 11/2001 | Besser et al. | |
| 6,323,554 B1 | 11/2001 | Joshi et al. | |
| 6,342,733 B1 | 1/2002 | Hu et al. | |
| 6,383,925 B1 | 5/2002 | Ngo et al. | |
| 6,429,128 B1 | 8/2002 | Besser et al. | |
| 6,506,677 B1 | 1/2003 | Avanzino et al. | |
| 6,617,690 B1 * | 9/2003 | Gates et al. | 257/758 |
| 6,764,951 B1 | 7/2004 | Van Ngo | |
| 6,797,652 B1 | 9/2004 | Ngo et al. | |
| 6,818,557 B1 | 11/2004 | Ngo et al. | |
| 7,102,232 B2 * | 9/2006 | Clevenger et al. | 257/751 |
| 2003/0075808 A1 * | 4/2003 | Inoue et al. | 257/774 |
| 2003/0134499 A1 | 7/2003 | Chen et al. | |
| 2005/0042889 A1 | 2/2005 | Lee et al. | |

FOREIGN PATENT DOCUMENTS

WO    WO0108213 A1    2/2001

OTHER PUBLICATIONS

Balseanu, et al., "Stress Modulation of Pecvd Silicon Nitride" Meeting Abstract, Electrochemical Society, Pennington, NJ, US, vol. MA 2005-2, 2005, p. 1042.
Ishikawa, et al., "Impact of CU Barrier Dielectrics Upon Stress-Induced Voiding of Dual-Damascene Copper Interconnects" Interconnect Technology Conference, 20005. Proceedings of the IEEE 2005, pp. 39-41.

* cited by examiner

*Primary Examiner*—Thanh Nguyen
(74) *Attorney, Agent, or Firm*—H. Daniel Schnurmann

(57) ABSTRACT

An interconnect structure and method of making the same are provided. The interconnect structure includes a dielectric layer having a patterned opening, a metal feature disposed in the patterned opening, and a dielectric cap overlying the metal feature. The dielectric cap has an internal tensile stress, the stress helping to avoid electromigration from occurring in a direction away from the metal line, especially when the metal line has tensile stress.

14 Claims, 3 Drawing Sheets

METHOD OF FORMING AN INTERCONNECT INCLUDING A DIELECTRIC CAP HAVING A TENSILE STRESS

BACKGROUND OF THE INVENTION

The present invention relates to microelectronics including microelectronic wiring elements and semiconductor integrated circuits having metal interconnect structures.

Electromigration is a problem which can seriously affect the long-term reliability of microelectronic elements. The problem can be particularly serious in copper interconnects which are provided as "back end of line" ("BEOL") structures of semiconductor integrated circuits ("ICs" or "chips"). Electromigration tends to occur at ends of horizontally oriented metal lines and locations where vertically oriented vias are joined to such metal lines, mainly because the metal lines are subject to different kinds of stresses at such locations.

Failure mechanisms include the formation of a void in the copper line and mass transport of copper which occurs along the interface of a layer of dielectric material used as a cap layer overlying the copper line. A common cause of such failure includes the positive divergence of metal ions moving downstream under force of the flow of electrons ("electron wind"). As deposited, copper lines include vacancies which are microscopic gaps between deposited particles. Over time and with application of heat and/or current, vacancies are prone to move and accumulate together to form voids having substantial size. As a result, voids tend to form in metal interconnects at locations upstream in the predominant path of electrons.

SUMMARY OF THE INVENTION

According to one aspect of the invention, an interconnect structure and method of making the interconnect structure are provided. The interconnect structure includes a dielectric layer having a patterned opening, a metal feature disposed in the patterned opening, and a dielectric cap overlying the metal feature. The dielectric cap has an internal tensile stress, such stress helping to avoid electromigration of the metal in a direction leading away from the metal line, especially when the metal line has an internal tensile stress.

In an embodiment of the invention, the dielectric cap is formed by depositing multiple layers of a thin dielectric material, each layer being under about 50 angstroms in thickness. Each dielectric layer is plasma treated prior to depositing each succeeding dielectric layer such that the dielectric cap has an internal tensile stress.

In accordance with one aspect of the invention, an interconnect structure is provided which includes a dielectric layer having a patterned opening and a metal feature disposed in the patterned opening. A dielectric cap is provided which overlies the metal feature, the dielectric cap having an internal tensile stress.

According to a particular aspect of the invention, the metal feature includes at least one metal selected from the group consisting of aluminum, copper, tungsten, silver, gold, and nickel.

According to a particular aspect of the invention, the metal feature includes a diffusion barrier layer lining the walls and bottom of the patterned opening and a filling of copper overlying the diffusion barrier layer within the opening.

In accordance with one aspect of the invention, an upper surface of the dielectric layer defines a major surface, the patterned opening is a first patterned opening oriented in a direction parallel to the major surface and the metal feature is a first metal feature. The dielectric layer further includes a second patterned opening which is aligned with the first patterned opening and oriented in a direction transverse to the major surface. According to such aspect of the invention, the interconnect structure further includes a second metal feature disposed in the second patterned opening, the second metal feature being conductively connected to the first metal feature.

According to a particular aspect of the invention, the dielectric cap layer includes one or more dielectric materials or combinations of dielectric materials selected from the group consisting of silicon dioxide ($SiO_2$), $Si_3N_4$, and $SiC_xN_yH_z$, where x, y and z are variable percentages.

According to a particular aspect of the invention, a plurality of the dielectric cap layers are formed successively in a stacked arrangement, each of the dielectric cap layers having internal tensile stress.

In accordance with one aspect of the invention, the plurality of dielectric cap layers includes at least three dielectric cap layers, each of the dielectric cap layers having a thickness between about 5 angstroms and 50 angstroms.

According to a particular aspect of the invention, a dielectric underlayer is provided which underlies the plurality of dielectric cap layers but overlies the metal feature, the dielectric underlayer having a thickness substantially greater than 50 angstroms.

In accordance with one aspect of the invention, a diffusion barrier layer is aligned with the metal feature and contacts the metal feature, and the dielectric cap layer overlies the diffusion barrier layer.

In accordance with a particular aspect of the invention, the diffusion barrier layer has a thickness between about 10 angstroms and about 500 angstroms.

An integrated circuit is provided according to another aspect of the invention. The integrated circuit includes an interconnect structure which has a dielectric layer having a patterned opening and a metal feature disposed in the patterned opening. A dielectric cap is provided over the metal feature, the dielectric cap having an internal tensile stress.

In a particular aspect of the invention, the metal feature includes at least one metal selected from the group consisting of aluminum, copper, tungsten, silver, gold, and nickel.

In a particular aspect of the invention, the metal feature includes a diffusion barrier layer lining the walls and bottom of the patterned opening and a filling of copper overlying the diffusion barrier layer within the patterned opening.

According to one aspect of the invention, an upper surface of the dielectric layer defines a major surface. The patterned opening is a first patterned opening and is oriented in a direction parallel to the major surface. The metal feature is a first metal feature. According to such aspect of the invention, the dielectric layer includes a second patterned opening aligned with the first patterned opening, the second patterned opening oriented in a direction transverse to the major surface. According to such aspect of the invention, the interconnect structure further includes a second metal feature disposed in the second patterned opening which is conductively connected to the first metal feature.

In a particular aspect of the invention, the dielectric cap layer consists essentially of one or more dielectric materials or combinations of dielectric materials selected from the group consisting of silicon dioxide ($SiO_2$), $Si_3N_4$, and $SiC_xN_yH_z$, where x, y and z are variable percentages.

According to another aspect of the invention, a method is provided for forming an interconnect structure. According to such method, an opening is patterned in a dielectric layer. A metal feature is formed in the patterned opening. A dielectric cap is formed over the metal feature, the dielectric cap having an internal tensile stress.

In accordance with a particular aspect of the invention, the dielectric cap is formed by depositing a layer of dielectric material and plasma treating the deposited layer.

According to one aspect of the invention, the metal feature includes at least one metal selected from the group consisting of aluminum, copper, tungsten, silver, gold, and nickel.

In a particular aspect of the invention, the step of forming the metal feature includes forming a diffusion barrier layer lining the walls and bottom of the patterned opening and a filling of copper overlying the diffusion barrier layer within the patterned opening.

According to one aspect of the invention, an upper surface of the dielectric layer defines a major surface, the patterned opening is a first patterned opening and is oriented in a direction parallel to the major surface and the metal feature is a first metal feature. Such method further includes patterning a second opening aligned with the first patterned opening, the second opening being oriented in a direction transverse to the major surface. In such method, the step of forming the metal feature includes forming a second metal feature in the second patterned opening, the second metal feature being conductively connected to the first metal feature.

According to one aspect of the invention, the dielectric cap layer consists essentially of one or more dielectric materials or combinations of dielectric materials selected from the group consisting of silicon dioxide ($SiO_2$), $Si_3N_4$, and $SiC_xN_yH_z$, where x, y and z are variable percentages. According to a particular aspect of the invention, the step of forming the dielectric cap includes depositing each of a plurality of the dielectric cap layers and plasma treating each dielectric cap layer prior to depositing each successive dielectric cap layer such that each of the dielectric cap layers has internal tensile stress. The dielectric cap can include one or more dielectric cap layers, and preferably includes at least three such dielectric cap layers.

In accordance with a particular aspect of the invention, the dielectric cap layer is formed to have a thickness between about 5 angstroms and 50 angstroms. A dielectric underlayer may be formed over the metal feature prior to forming the plurality of dielectric cap layers, the underlayer preferably having a thickness substantially greater than 50 angstroms.

According to a particular aspect of the invention, a metal barrier layer may be deposited in contact with an upper surface of the metal feature prior to forming the dielectric cap. According to a particular aspect of the invention, the metal barrier layer includes an alloy of cobalt. In a particular embodiment, the metal barrier layer has a thickness of between about 10 angstroms and about 500 angstroms.

DETAILED DESCRIPTION

In accordance with the embodiments of the invention herein, one goal is reducing unwanted transport of copper in an outward direction from the metal lines of a chip. Another goal is avoiding or reducing the incidence of voids at an interface between a via and a metal line.

Figure 1:
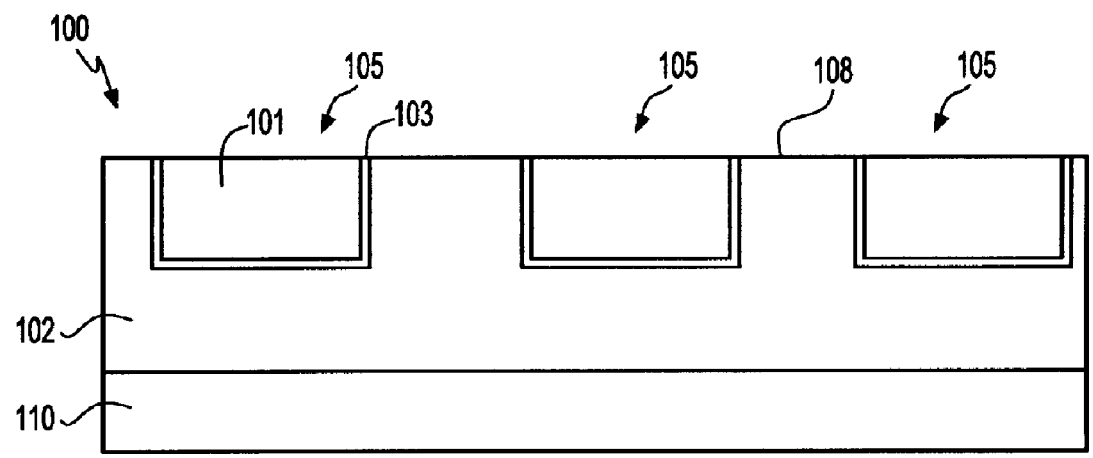
FIG. 1 is a sectional view of a structure of a semiconductor chip in a stage of fabrication in accordance with an embodiment of the invention.

FIG. 1 is a sectional view of a portion of a microelectronic element or chip in which a plurality of metal interconnects are provided by metal fillings 101 formed in patterned openings 105 in accordance with an embodiment of the invention. FIG. 1 illustrates a stage in fabrication in which an interlevel dielectric layer or "ILD" 102 has been formed. The ILD typically overlies an active semiconductor layer 110 of a semiconductor chip 100, the active semiconductor layer including one or more active devices and conductive interconnects (not shown) formed by so-called "front end of line" processing, such conductive interconnects providing a basis for connection to the metal fillings 101. Within the ILD, a plurality of patterned openings 105 are provided, typically in form of line patterns which extend horizontally in a direction of a major surface 108 which is defined by the upper surface of the dielectric layer 102, or which extend in a direction parallel to such surface. Within each patterned opening, a diffusion barrier material 103 is deposited to line the walls and bottom of each opening, after which a metal 101 is deposited to fill the remaining space within each opening. These steps are followed typically by a planarization process, such as a chemical mechanical polishing ("CMP") process, which removes any excess metal that contacts the upper surface 108 of the ILD 102 outside of the patterned openings 105.

The metal 101 that fills each opening in the dielectric layer 102 is preferably a metal, for example, a noble metal, that is not prone to destructive corrosion and has good conductive properties. However, a few metals and alloys of metals stand out as being especially suited for forming conductive interconnect lines in the BEOL fabrication of integrated circuits or chips. Such metals include aluminum, copper, tungsten, silver, gold, aluminum-copper and nickel. In a particular embodiment, the metal 101 which fills the patterned opening 105 in the dielectric layer 102 consists essentially of copper. When the metal filling 101 includes copper or other metal prone to diffusing through dielectric materials, i.e., when the metal has a "high coefficient of diffusion", the layer 101 is preferably formed over a layer of metal or compound of a metal which functions as a diffusion barrier. The diffusion barrier prevents the copper from diffusing from the metal filling 101 into the ILD 102 adjacent to the walls and bottom of the metal line. The barrier layer is preferably formed by sputtering, using chemical vapor deposition ("CVD"), or atomic layer deposition ("ALD") to deposit a metal or compound of metal which does not interact with the copper, such that the barrier layer does not affect the conductive properties of the copper or interact with the dielectric material of the ILD 102 to affect its dielectric properties. Such barrier layers are well-known and need not be discussed further.

Figure 2:
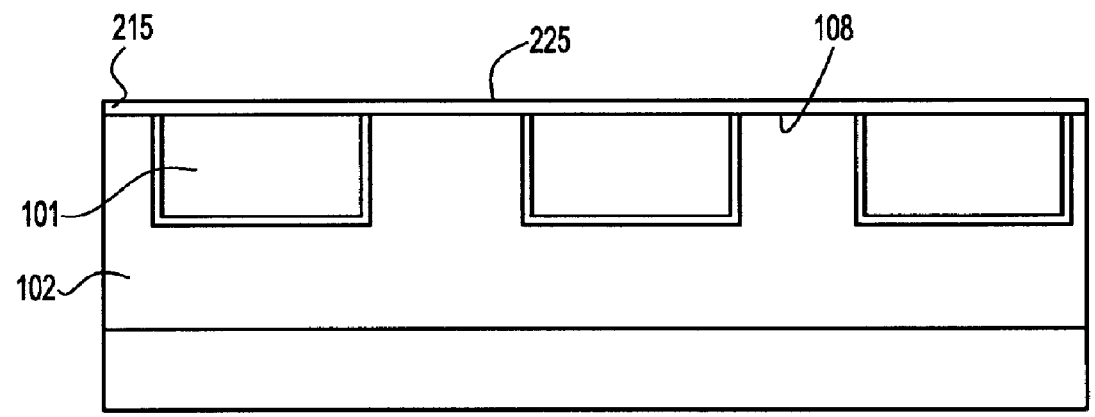
FIG. 2 is a sectional view of a structure of a semiconductor chip in a stage of fabrication subsequent to that of FIG. 1, in accordance with an embodiment of the invention.

Next, referring to FIG. 2, the exposed major surface 108 of the ILD 102 and the metal filled line patterns 101 are subjected to plasma treatment, preferably using a combination of ammonia and nitrogen species ($NH_3$ and $N_2$) or, alternatively, hydrogen ($H_2$).

After plasma treatment, this is followed by the deposition of a dielectric cap layer 215. The first dielectric cap layer 215 can include any dielectric material or combination of dielectric materials which is capable of maintaining a stress relative to the metal filled line patterns. Preferably, the first dielectric cap layer consists essentially of one or more dielectric materials or combinations of dielectric materials selected from the group consisting of silicon dioxide (SiO$_2$), silicon nitride (Si$_3$N$_4$), and or other dielectric compound of silicon such as SiC$_x$N$_y$H$_z$, where x, y and z are variable percentages. The plasma treatment and dielectric cap deposition are preferably performed in situ, i.e., in the same process chamber or in the same tool having one or more connected chamber. In that way, it is performed without having to manually remove the substrate from the chamber to deposit the dielectric cap after plasma treating the surface of the ILD. In one embodiment, a first dielectric cap layer 215 is deposited to cover the upper surface 108 of the ILD 102 to a thickness of less than about 50 angstroms. After deposition, the exposed upper surface 225 of the first dielectric cap layer 215 is subjected to a second plasma treatment. The second plasma treatment has an effect of imparting a tensile stress to the first dielectric cap layer 215.

Figure 3:
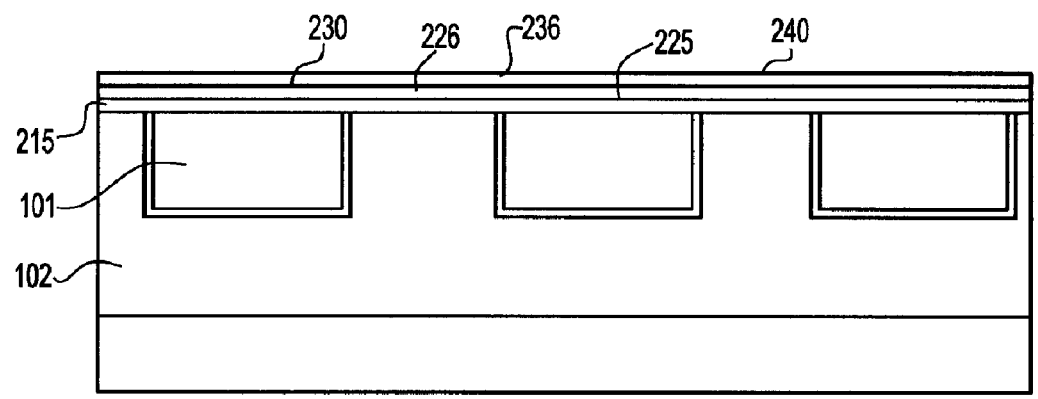
FIG. 3 is a sectional view of a structure of a semiconductor chip in a stage of fabrication subsequent to that of FIG. 2, in accordance with an embodiment of the invention.

Thereafter, referring to FIG. 3, a second dielectric cap layer 226 is deposited to cover the upper surface 225 of the first dielectric cap layer. Like the first dielectric cap layer 215, the second dielectric cap layer 226 preferably is formed to a thickness of less than about 50 angstroms. Like the first dielectric cap layer 215, the second dielectric cap layer can include any dielectric material or combination of dielectric materials which is capable of maintaining a stress. Preferably, the second dielectric cap layer consists essentially of one or more dielectric materials or combinations of materials selected from the group consisting of silicon dioxide, silicon nitride and a compound of silicon, carbon, nitrogen and hydrogen in the form of SiC$_x$N$_y$H$_z$, where x, y and z are variable percentages. Preferably, the second dielectric cap layer consists essentially of the same dielectric material as the first dielectric cap layer. Like the first dielectric cap layer, the upper surface 230 of the second dielectric cap layer 226 also undergoes plasma treatment after deposition to control the tensile stress of the deposited second dielectric cap layer, preferably using the same species that are used during the plasma treatment of the first dielectric cap layer. For example, the plasma treatment can include a mixture of ammonia and nitrogen, or alternatively, hydrogen as the reactive species. As in the case of the first dielectric cap layer, these deposition and plasma treatment processes are preferably performed in situ.

Following deposition and plasma treatment of the second dielectric cap layer 226, a third dielectric cap layer 236 is deposited to cover the upper surface 230 of the second dielectric cap layer. Like the first and second dielectric cap layers 215 and 226, the third dielectric cap layer 236 is formed to a thickness of less than about 50 angstroms. Like the first and second dielectric cap layers 215, 226, the third dielectric cap layer can include any dielectric material or combination of dielectric materials which is capable of maintaining a stress. Preferably, the third dielectric cap layer consists essentially of one or more dielectric materials or combinations of dielectric materials selected from the group consisting of silicon dioxide, silicon nitride and a compound of silicon, carbon, nitrogen and hydrogen in the form of SiC$_x$N$_y$H$_z$. Again, preferably, the third dielectric cap layer 236 consists essentially of the same dielectric material as the first and second dielectric cap layers. As in the plasma treatments performed to the first and second dielectric cap layers, the upper surface 240 of the third dielectric cap layer 236 also undergoes plasma treatment after deposition to control or produce a tensile stress in the third dielectric cap layer, preferably using the same species that are used during the plasma treatment of the first and second dielectric cap layers. For example, the plasma treatment can include a mixture of ammonia and nitrogen, or alternatively, hydrogen as the reactive species. As in the case of the first and second dielectric cap layers, these deposition and plasma treatment processes are preferably performed in situ.

The goal of successively depositing the dielectric cap layers and the plasma treatments is to achieve a dielectric cap which has an internal tensile stress. The internally tensile stressed dielectric cap will exert a compressive stress at the surface of the metal fill material 101 which it contacts. As a result, the metal fill, e.g., copper fill, is less likely to exert a tensile stress on the metal features it contacts, which could then result in the problems described above in the background. Note that the number of dielectric cap layers that are used and other parameters associated with their fabrication are not of primary importance. Rather, the magnitude and stability of the internal tensile stress of the dielectric cap are of greater importance. Therefore, if a single layer of the dielectric cap material is deposited to have the required internal tensile stress of the desired magnitude and properties, then a single such dielectric cap layer suffices. On the other hand, if more than three such dielectric cap layers are needed to achieve these properties, then more than three such dielectric cap layers need to be deposited and plasma treated in accordance with the method described above.

Figure 4:
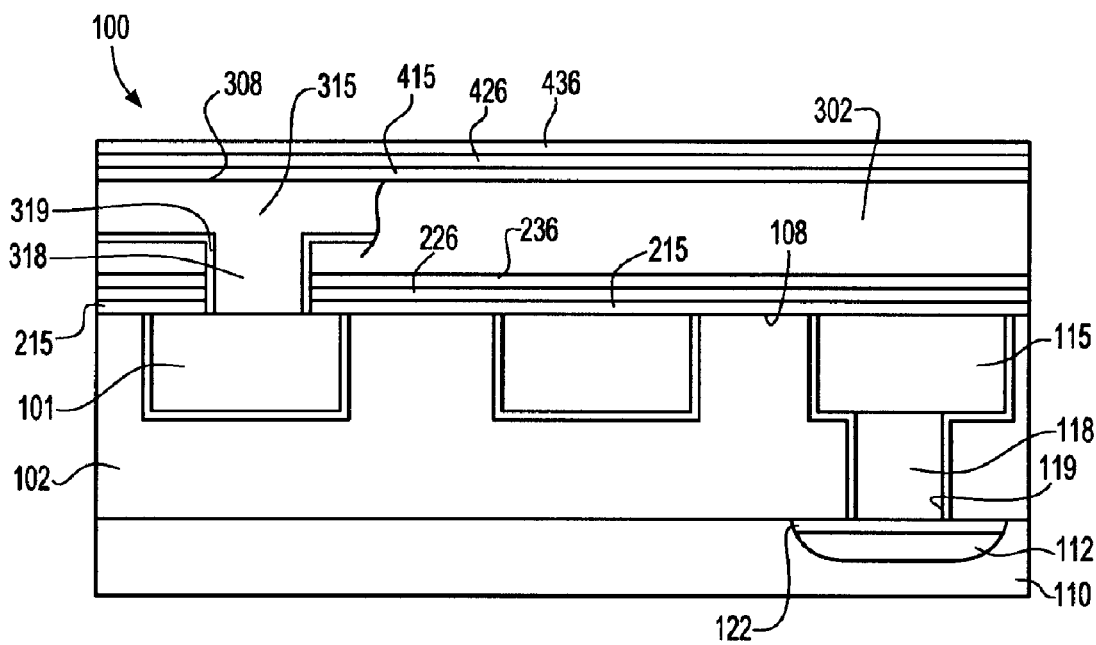
FIG. 4 is a sectional view of a structure of a semiconductor chip in accordance with an embodiment of the invention.

FIG. 4 is a sectional view illustrating a preferred embodiment of an active semiconductor chip 100 which includes a metal interconnect fabricated in accordance with the above-described method. In such embodiment, a metal line 115 is oriented in a horizontal direction, i.e., in a direction into and out of the page in FIG. 4, such direction also being parallel to the upper surface 108 of the ILD 102. A vertically oriented conductive via 118 conductively contacts a layer of metal silicide 122 overlying an active area 112 of an active semiconductor layer 110 to provide conductive communication between the active area 112 and the metal line 115. The ILD 102 electrical isolates the via 118 and the metal line 115 from other features of the semiconductor chip 100. In one embodiment, the conductive via 118 is filled with a metal such as tungsten or the same metal, e.g., copper, which is used to fill the metal line 115. As the case with the metal lines, when the via 118 is filled with a metal such as copper which has a high coefficient of diffusion, the walls of the via 118 are preferably lined with a barrier material 119. Alternatively, the conductive via 118 can be filled with doped polysilicon or compound of silicon, e.g., a conductive or metal silicide, or the via 118 can be filled with a combination of doped polysilicon and conductive compound of silicon. In such case, the barrier layer 119 may or may not be present, as it is not necessary to prevent such silicon-containing conductive fill from diffusing from the via into the ILD.

FIG. 4 further illustrates the structure of a second level metal line 315 which is disposed in a second interlayer dielectric level ("ILD2") 302 overlying the metal interconnects formed in the first interlayer dielectric level (ILD 102), and overlying the dielectric cap provided in form of three dielectric cap layers 415, 426 and 436. In an exemplary arrangement, the metal interconnect line 315 is oriented in a horizontal direction parallel to the upper surface 108 of the first ILD 102, the metal interconnect line 315 being transverse to the direction of metal line 115. The second level metal line 315, like the first metal line 115, is disposed in a patterned opening of a dielectric layer, ILD2 (302). The dielectric cap layers 415, 426 and 436 are successively deposited and plasma-treated to overlie the second level metal line in order to apply a compressive stress at the interfacial upper surface 308 of the second metal line 315. The second level metal line 315 is preferably conductively connected by a conductive via 318 to the metal filling 101 of a metal line provided in the first ILD 102.

The conductive via 318 is preferably provided by etching a vertically oriented opening in ILD2 302 and the existing dielectric cap layers 215, 226 and 236. Thereafter, a diffusion barrier layer 319 is preferably deposited to line the walls of the via 318 and the walls and bottom of the horizontally oriented opening above the via. A layer of metal is then deposited to fill the remaining opening, followed by a CMP process to form the metal line, in a manner similar to that described above for forming the metal lines within the first ILD 102. Subsequently, as further shown in FIG. 4, a series of dielectric cap layers are deposited and plasma-treated, each in succession, until a dielectric cap having the desired internal stress property and stability results. The dielectric cap layers can include any dielectric material or combination of dielectric materials which is capable of maintaining a stress. However, preferably, the dielectric cap layers consist essentially of one or more dielectric materials or combinations of dielectric materials selected from the group consisting of silicon dioxide, silicon nitride and a compound of silicon, carbon, nitrogen and hydrogen in the form of $SiC_xN_yH_z$, where x, y and z are variable percentages.

Figure 5:
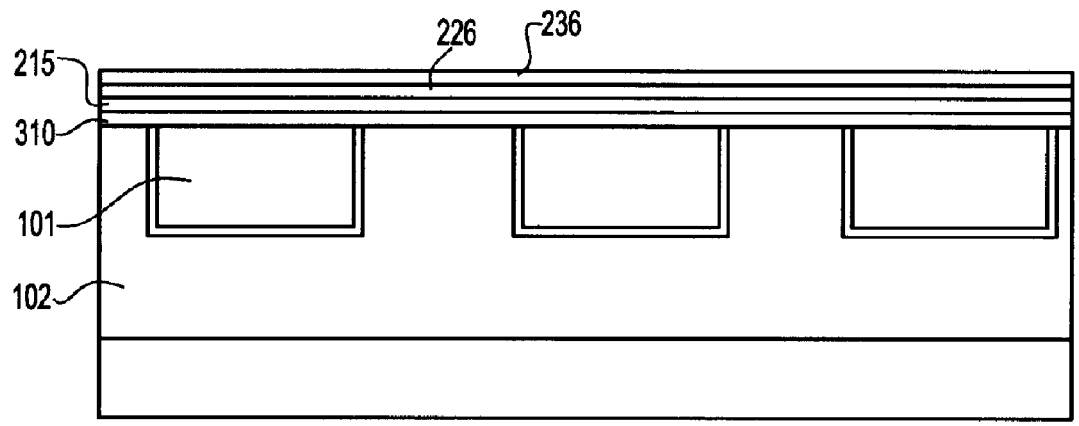
FIG. 5 is a sectional view of a structure of a semiconductor chip in accordance with another embodiment of the invention.

FIG. 5 illustrates a variation of the above-described embodiment. In such variation, a thicker dielectric cap layer 310 is first deposited to cover the ILD 102 and metal line patterns 101 therein, prior to successively depositing and plasma-treating the series of individual relatively thin dielectric cap layers 215, 226 and 236. In this embodiment, the thicker dielectric layer has a thickness preferably between about 50 angstroms and about 500 angstroms. This layer 310 can include any dielectric material or combination of dielectric materials which is capable of maintaining a stress. The layer 310 preferably consists essentially of one or more dielectric materials or combination of dielectric materials selected from the group consisting of silicon dioxide, silicon nitride or a compound of silicon, carbon, nitrogen and hydrogen according to the formula $SiC_xN_yH_z$, where x, y and z are variable percentages. Preferably, the dielectric layer 310 consists essentially of the same material at that from which the overlying dielectric cap layers 215, 226, and 236 are formed. In a preferred embodiment, the thicker dielectric layer 310 is formed by depositing one or more dielectric materials selected from the group consisting of silicon dioxide, silicon nitride or a compound of silicon, carbon, nitrogen and hydrogen according to the formula $SiC_xN_yH_z$, where x, y and z are variable percentages, followed by plasma treatment in a manner as described above.

Figure 6:
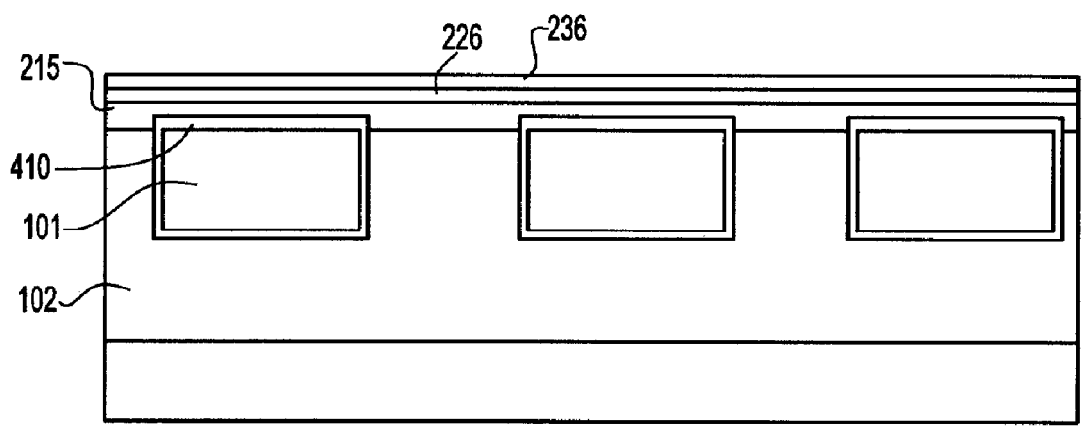
FIG. 6 is a sectional view of a structure of a semiconductor chip in accordance with yet another embodiment of the invention.

In another embodiment illustrated in the sectional view of FIG. 6, a metal capping layer 410 is selectively deposited to cover each of the metal lines 101, prior to formation of the tensile-stressed dielectric cap layers 215, 226 and 236. Such metal capping layer preferably functions as a diffusion barrier helping to prevent a metal within metal line 101 such as copper, which has a high diffusion coefficient, from diffusing into the dielectric cap layers or the ILD 102. Such metal capping layer preferably consists essentially of a metal compound which is compatible with copper and which can be selectively deposited, e.g., plated onto the metal lines 101, such as by electroplating or electro-less plating. In an exemplary embodiment, the metal capping layer 410 consists essentially of one or more compounds selected from the group consisting of CoWP, CoSnP, CoP, CoB, CoSnB, and CoWB. Preferably, the metal capping layer has a thickness between about 10 angstroms and 500 angstroms. Preferably, the metal capping layer is selectively deposited onto the metal lines after excess metal from prior processing to form the metal lines has been removed, as through a CMP process.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of forming an interconnect structure, comprising:
    (a) patterning an opening in a dielectric layer;
    (b) forming a metal feature in said patterned opening; and
    (c) forming a dielectric cap directly on an exposed surface of said metal feature, wherein said dielectric cap includes one or more dielectric layers and said dielectric cap has a net internal tensile stress, such that said net tensile-stressed dielectric cap induces a net compressive stress at a surface of said metal feature in contact with said dieletric cap to improve electromigration performance of said metal feature.

2. The method as claimed in claim 1, wherein said dielectric cap is formed by depositing a layer including a dielectric material and plasma treating said deposited layer to cause said dielectric layer to have a net internal tensile stress.

3. The method as claimed in claim 2, wherein said metal feature includes at least one metal selected from the group consisting of aluminum, copper, tungsten, silver, gold, and nickel.

4. The method as claimed in claim 2, wherein said step of forming said metal feature includes depositing a diffusion barrier layer lining walls and a bottom of said patterned opening to form a lined opening and filling said lined opening with copper.

5. The method as claimed in claim 4, wherein an upper surface of said dielectric layer defines a major surface, said patterned opening is a first patterned opening oriented in a first direction parallel to said major surface and said metal feature is a first metal feature, said method further comprising patterning a second opening aligned with said first patterned opening, said second opening oriented in a second direction transverse to said first direction, and said step of forming said metal feature includes forming a second metal feature in said second patterned opening, said second metal feature conductively connected to said first metal feature.

6. The method as claimed in claim 2, wherein said dielectric cap includes at least one material selected from the group consisting of silicon dioxide ($SiO_2$), $Si_3N_4$, and $SiC_xN_yH_z$, where x, y and z are variable percentages.

7. The method as claimed in claim 2, wherein said step (c) of forming said dielectric cap includes (i) depositing a first dielectric cap layer and then plasma treating said first dielectric cap layer to cause said first dielectric cap to have an internal tensile stress, and (ii) then depositing a second dielectric cap layer onto an exposed surface of said first internally stressed dielectric cap layer formed in (i) and then plasma treating said second dielectric cap layer to cause said second dielectric cap layer to have an internal tensile stress.

8. The method as claimed in claim 7, further comprising (iii) after step (c)(ii) then depositing a third dielectric cap layer onto an exposed surface of said internally stressed second dielectric cap layer formed in (ii) and then plasma treating said third dielectric cap layer to cause said third dielectric cap layer to have an internal tensile stress.

9. The method as claimed in claim 7, wherein each said dielectric cap layer is formed to have a thickness between about 5 angstroms and 51 angstroms.

10. The method as claimed in claim 1, wherein said step (c) of forming said dielectric cap includes (i) depositing a relatively thick dielectric cap layer and then plasma treating said relatively thick dielectric cap layer to produce a dielectric can lover having an internal tensile stress, (ii) then depositing a relatively thin, second dielectric cap layer onto an exposed surface of the relatively thick dielectric cap layer having the internal tensile stress and then plasma treating the second dielectric cap layer to produce a second dielectric cap layer having an internal tensile stress, and (iii) then depositing a relatively thin, third dielectric cap layer onto an exposed surface of the second dielectric cap layer having the internal tensile stress and then plasma treating the third dielectric cap layer to produce a third dielectric cap layer having an internal tensile stress.

11. The method as claimed in claim 10, wherein said relatively thick dielectric cap layer has a thickness substantially greater than 50 angstroms.

12. The method as claimed in claim 2, wherein step (b) includes depositing a first metal filling within said patterned opening and selectively depositing a metal barrier layer in contact with an upper surface of said first metal filling.

13. The method as claimed in claim 12, wherein said metal barrier layer includes an alloy of cobalt.

14. The method as claimed in claim 13, wherein said metal barrier layer has a thickness between about 10 angstroms and about 500 angstroms.

* * * * *